(12) United States Patent
Kumar et al.

(10) Patent No.: US 12,337,703 B2
(45) Date of Patent: Jun. 24, 2025

(54) GROUND IMPEDANCE AND FAULT DETECTION SYSTEM AND METHOD

(71) Applicant: Transportation IP Holdings, LLC, Norwalk, CT (US)

(72) Inventors: Ajith Kuttannair Kumar, Erie, PA (US); Jacob Pressman, Erie, PA (US); Neil Burkell, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 286 days.

(21) Appl. No.: 18/124,181

(22) Filed: Mar. 21, 2023

(65) Prior Publication Data

US 2023/0234448 A1 Jul. 27, 2023

Related U.S. Application Data

(63) Continuation-in-part of application No. 17/372,133, filed on Jul. 9, 2021, now Pat. No. 11,637,421.

(51) Int. Cl.
  *B60L 3/00* (2019.01)
  *B60L 3/04* (2006.01)

(52) U.S. Cl.
  CPC ........... *B60L 3/0069* (2013.01); *B60L 3/0046* (2013.01); *B60L 3/04* (2013.01)

(58) Field of Classification Search
  CPC ...... G01R 31/52; G01R 31/006; G01R 31/42; H02H 1/0007; H02H 3/042; H02H 3/16; H02H 7/18; B60L 3/0046; B60L 3/0069; B60L 3/04
  See application file for complete search history.

(56) References Cited

U.S. PATENT DOCUMENTS

| 11,637,421 B2* | 4/2023 | Pressman | H02H 3/16 |
| | | | 361/42 |
| 2013/0272039 A1 | 10/2013 | Saniter et al. | |
| 2013/0300430 A1* | 11/2013 | Lindsay | B60L 58/21 |
| | | | 324/522 |

(Continued)

FOREIGN PATENT DOCUMENTS

| CN | 206281924 U | 6/2017 | |
| EP | 2808687 A1 * | 12/2014 | ........... G01R 31/025 |

(Continued)

OTHER PUBLICATIONS

Office Action mailed May 5, 2023 for corresponding Japanese Patent Application No. 2022-087030. English translation provided. (5 pages).

*Primary Examiner* — Jared Fureman
*Assistant Examiner* — Nicolas Bellido
(74) *Attorney, Agent, or Firm* — K&L Gates LLP

(57) ABSTRACT

A ground impedance and fault detection system may include a controller that can identify a location of a ground fault in a circuit. The circuit also may include one or more positive contactors connected with a positive portion of the bus between battery strings and a load and a negative bus contactor coupled with a negative portion of the bus between the battery strings and the loads. The controller may identify the ground fault by opening the one or more positive contactors and closing the negative bus contactor, measuring the voltages using the impedance devices, and comparing the voltages that are measured.

20 Claims, 9 Drawing Sheets

(56) References Cited

U.S. PATENT DOCUMENTS

| | | | | |
|---|---|---|---|---|
| 2014/0301000 A1* | 10/2014 | Takahashi | ........... | H01M 10/482 |
| | | | | 361/42 |
| 2018/0224494 A1* | 8/2018 | Iwanabe | ................ | G01R 31/64 |
| 2023/0010565 A1* | 1/2023 | Pressman | ............... | G01R 31/42 |

FOREIGN PATENT DOCUMENTS

| | | |
|---|---|---|
| JP | 2010019603 A | 1/2010 |
| JP | 2014126510 A | 7/2014 |

\* cited by examiner

GROUND IMPEDANCE AND FAULT DETECTION SYSTEM AND METHOD

CROSS-REFERENCE TO RELATED APPLICATIONS

This application is a continuation-in-part of U.S. patent application Ser. No. 17/372,133 (filed 9 Jul. 2021), the entire disclosure of which is incorporated herein by reference.

BACKGROUND

Technical Field

The subject matter described herein relates to detection of ground faults within energy storage systems.

Discussion of Art

A variety of energy storage systems may use electric energy stored in batteries to power one or more components of a powered system. There may be many opportunities for ground faults to occur in the energy storage systems. Energy storage devices and systems are becoming more prolific, which may create more potential failure points. Additionally, energy storage devices are being used in more safety critical applications (such as self-driving cars at high speeds), and the voltages of these devices continues to increase, which increases the risk of ground faults. Detection of ground faults as early as possible is desirable, as the second or additional ground faults can be detrimental or disastrous to the energy storage systems.

Some known ground fault detection systems require the addition of significant equipment and/or dedicated passive circuits to detect ground faults. Both can lead to high cost and extra components to package with the energy storage systems. Also, other systems can have blind spots where a ground fault failure may go undetected.

Therefore, a need exists for systems and methods for detecting ground faults in energy storage systems, that do not require the addition of significant equipment or dedicated passive circuits.

BRIEF DESCRIPTION

In one example, a ground impedance and fault detection system may include a controller that can identify a location of a ground fault in a circuit having a positive portion of a bus that connects positive terminals of battery strings with loads and a negative portion of the bus that connects negative terminals of the battery strings with the loads. The circuit also may include a ground reference between the positive portion and the negative portion of the bus with impedance devices that can measure voltages on opposite sides of the ground reference. The circuit also may include one or more positive contactors connected with the positive portion of the bus between the battery strings and the load and a negative bus contactor coupled with the negative portion of the bus between the battery strings and the loads. The controller may identify the ground fault by opening the one or more positive contactors and closing the negative bus contactor, measuring the voltages using the impedance devices, and comparing the voltages that are measured.

In another example, a method for detecting ground faults may include opening one or more positive contactors in a circuit having a positive portion of a bus that connects positive terminals of battery strings with loads and a negative portion of the bus that connects negative terminals of the battery strings with the loads. The circuit also may include a ground reference between the positive portion and the negative portion of the bus with impedance devices configured to measure voltages on opposite sides of the ground reference. The method also can include closing a negative bus contactor coupled with the negative portion of the bus between the battery strings and the loads, measuring the voltages using the impedance devices, and determining a ground fault location in the circuit by comparing the voltages that are measured.

In another example, another ground fault identification system may include a controller that can identify a ground fault in a circuit having a positive portion of a bus that connects positive terminals of battery strings with an inverter and a negative portion of the bus that connects negative terminals of the battery strings with the inverter. The circuit also may include a ground reference between the inverter and a load that is powered by the battery strings and the inverter. The circuit can include an impedance device configured to measure voltages between the inverter or the load and the ground reference. The controller may identify the ground fault by asynchronously sampling the voltages measured by the load impedance device to identify the ground fault associated with the load.

BRIEF DESCRIPTION OF THE DRAWINGS

The inventive subject matter may be understood from reading the following description of non-limiting embodiments, with reference to the attached drawings, wherein below.

DETAILED DESCRIPTION

Embodiments of the subject matter described herein relate to energy storage system with ground impedance and/or fault detection capabilities and associated methods. These capabilities may determine ground impedances, which can be used to detect ground faults in the energy storage systems. The energy storage systems can have energy storage devices, such as battery cells. The systems and methods may be cost-effective to implement by changing or adding to the software or other programming of controllers of the energy storage systems. Energy storage devices can be connected and/or disconnected using a set of switches (contactors, etc.) for protection of the energy storage devices. The energy storage devices may have impedances that are referenced to the ground reference on a conductive battery bus (that conductively couples the energy storage devices) to measure voltage, serve as high voltage indicators, or the like. These impedances can be on either side of the switches and be used to shift or otherwise move the ground reference when opening or closing the switches. Shifting the ground reference brings visibility to faults in the energy storage systems using existing components in the powered system, such as precharge resistors, inverters, isolation contactors, etc. The inverter (or like switching component) can also be used to accomplish tests such as a tan delta test without additional components.

Detection can be accomplished without adding components to package and the cost that comes along with the additional components. Space that is taken up by other components is less space for stored energy and may be more cost in the powered system.

In one embodiment, voltage measurements in an energy storage system may be used. One method may be to use inductance, while another may be used to determine ground impedances. Measurements may be used to detect the magnitude and location of ground faults within the energy storage system. The ground reference of the energy storage system can be shifted by closing a switch (e.g., an isolation string contactor) to determine a ground impedance. When this impedance decreases below a designated threshold impedance, then a ground fault may be detected. The threshold impedance may change based on the battery cells (e.g., the chemistries of the cells, whether the cell are in parallel or series, power levels of the cells, voltages of the cells, temperatures of the cells, ages of the cells, etc.). Responsive to detection of the ground fault, an alarm or other notification to an operator may be generated, operation of a powered system (e.g., a vehicle or stationary system) that is at least partially powered by the energy storage system can be changed or deactivated, the cells may be disconnected (by opening one or more of the switches or contactors described herein), or the like.

Figure 1:
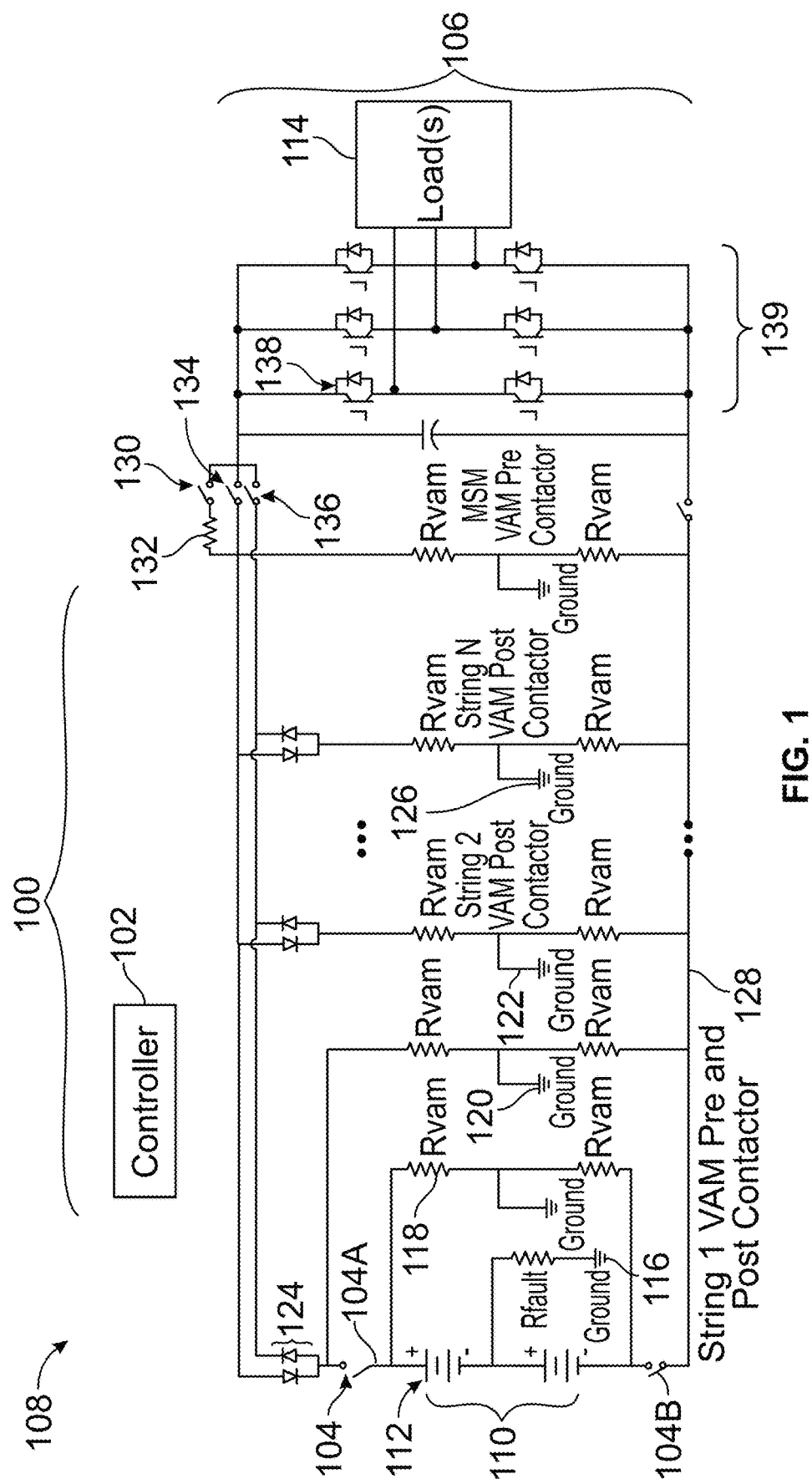
FIG. 1 illustrates one example of an energy storage system with ground impedance and/or fault detection capabilities.

FIG. 1 illustrates one example of an energy storage system 100. The system includes a controller 102 that operates to control states of electrically controllable switches 104 (e.g., switches 104A, 104B) in a circuit 106 of a powered system 108. The circuit includes a conductive bus 128 that conductively connects the components of the circuit with each other. This bus can represent one or more wires, traces, cables, or the like. The switch 104A can be referred to as a positive side switch as this switch is between the positive terminal, end, or output of the strings and the remainder of the circuit. The switch 104B can be referred to as a negative side switch as this switch is between the negative terminal, end, or output of the strings and the remainder of the circuit. The switches can be contactors or other types of electrical switches. The number and/or arrangement of the components of the circuit shown in FIG. 1 are provided merely as one example. Additional or fewer components may be provided, and/or the components may be in a different arrangement than what is shown.

The controller can represent hardware circuitry that includes and/or is connected with one or more processors (e.g., one or more integrated circuits, one or more field programmable gate arrays, one or more microprocessors, etc.) that operate to send signals via conductive pathways (e.g., wires, cables, conductive buses, conductive traces, etc.) and/or to send the signals wirelessly to the switches to control which switches are open, which switches are closed, and when switches are opened or closed. The controller can automatically generate these signals and/or can generate the signals based on input (e.g., from an operator and/or the powered system).

The circuit includes one or more strings 110 of battery cells 112 that supply energy (e.g., direct current) to one or more loads 114 of the powered system to power the loads. As described herein, a battery cell can refer to an electrochemical cell that is a device capable of generating electric energy from chemical reactions and/or storing electric energy for later use. A cell group can refer to two or more battery cells connected in parallel to each other. A cell stack can refer to two or more cell groups that are connected in series with each other. A pack can refer to two or more cell stacks connected in series with each other, and which optionally can be disposed in a packaging or housing. A string can refer to two or more packs connected in series with each other. Optionally, one or more of the switches may be disposed between subparts of at least one of the strings. For example, the positive side switch and/or negative side switch may be disposed between cells, between cell groups, between cell stacks, or between packs in a string.

The circuit can include a charging switch or contactor 134 that is opened or closed to couple the strings with the loads and a discharging switch or contactor 136 that is opened or closed to couple the strings with the external power source for charging the strings. The circuit can include a precharge switch or contactor 130 that is used to connect or disconnect the strings and the bus with a resistive element or load 132 to precharge the bus prior to closing the charging and discharging switches or contactors to couple the strings to the load and/or prior to closing the positive and negative side switches to couple an external power source (e.g., a utility grid, a generator, a traction motor operating as a generator, etc.) to the strings to charge the strings. The circuit can include switches 138 (e.g., IGBTs) of an inverter 139 that control conduction of the current from the strings to the load(s). The inverters can fire (e.g., close) at different times to convert the direct current supplied from the strings to an alternating current that is supplied to the load(s).

The powered system can represent a stationary or mobile system that is at least partially powered by electric energy stored in battery cells within the battery strings. For example, all the energy demand of the powered system may be provided by the battery strings or less than all the energy demand of the powered system may be provided by the battery strings. The powered system can be a vehicle, such as a mining vehicle, rail vehicle, automobile, truck, bus, marine vessel, agricultural vehicle, or the like. The loads can represent motors, lamps, processors, blowers, or the like.

The circuit includes a first ground reference connection 116 ("Ground" in FIG. 1) coupled with the strings by an impedance device 118 ("Rvam" in FIG. 1) in a location between the strings. The ground reference connections described herein connect the circuit with the earth ground reference or another ground reference (e.g., a vehicle body or chassis). The impedance device can represent a load of the circuit. By way of example, the impedance device can represent a lamp or light emitting diode, a voltage amplifier, a grid resistor, or the like. Optionally, the impedance device can represent a sensor that measures impedance, voltage, or the like, at the locations labeled in FIG. 1 (e.g., a voltmeter and ammeter, or Rvam). The impedance device can be used to measure an impedance when the device is powered by the string(s), as described herein. The impedance device between the ground reference and the positive side switch (or the positive end of the strings) can be referred to as the positive side impedance device. The impedance device between the ground reference and the negative side switch (or the negative end of the strings) can be referred to as the negative side impedance device.

The circuit includes a second ground reference connection 120 that is coupled with the strings by additional impedance devices in locations between each of the strings and the switches. A third ground reference connection 122 is coupled with the strings by additional impedance devices in a location between the positive side switch and a set of diodes 124 and in another location between the negative side switch and the load(s). One or more additional ground reference connections 126 are coupled with the strings by additional impedance devices and sets of diodes. The energy storage system optionally may have other equivalent strings disposed in parallel to the string shown in FIG. 1. These additional ground reference connections are coupled with the positive side switch by the sets of diodes between the positive side switch and the load(s) and are coupled with the negative side switch. One or more additional or fewer ground reference connections may be provided than what is shown in FIG. 1 (as represented by the ellipses in FIG. 1).

A ground fault in the strings can be made to be apparent (or more apparent) by mismatches in string positive and negative voltage measurements with respect to a ground reference. Comparing characteristics such as impedances (that can be calculated using these measured voltages), voltages, or the like, with respect to the ground before and after closing the switches can reveal the magnitude and location of ground faults. Closing the positive side switch or the negative side switch between measurements of the characteristics can shift the ground reference of the circuit to enable the magnitude and location of the ground fault to be identified. The magnitude of the ground fault is labeled as "Rfault" in FIG. 1.

Figure 2:
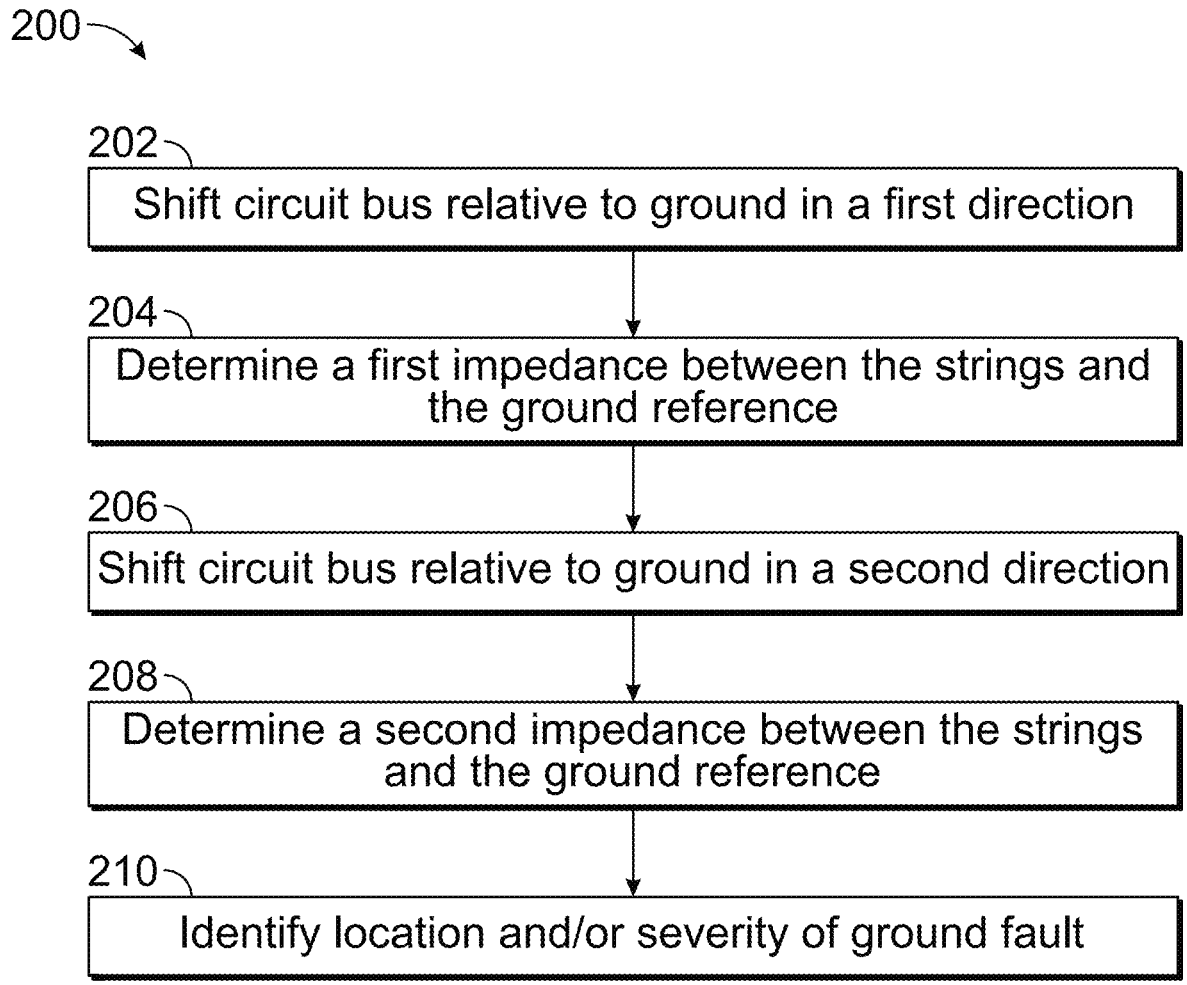
FIG. 2 illustrates a flowchart of one example of a method for identifying locations and/or magnitudes of ground impedances and/or faults in the strings of the circuit.

With continued reference to the circuit shown in FIG. 1, FIG. 2 illustrates a flowchart of one example of a method 200 for identifying locations and/or magnitudes of ground faults in the strings of the circuit. The method can be performed using existing components of the circuit and/or powered system. Stated differently, the location and/or magnitude of a ground fault in the strings can be identified by performing the operations described herein but without having to add any new components to the circuit or powered system. The impedance devices can be existing devices of the powered system that perform other operations, such as lights on a display inside a vehicle, resistors that dissipate regenerative energy created by dynamic breaking as heat, voltmeters/ammeters that are already present in the powered system (e.g., sensors that display the voltage of the strings to an operator), or the like. The switches can be existing switches or contactors used for other purposes, such as connecting or disconnecting the strings from the bus for controlling when the load(s) are receiving direct current from the strings, when the strings are being charged, etc.

At step 202, the bus of the circuit is shifted relative to the ground reference in a first direction. This shift can be implemented by changing closing one of the switches while keeping the other of the switches open. This changes the potential of the bus when compared with the earth ground or the vehicle chassis (e.g., the ground reference connections). The shift can occur in the first direction by opening the positive side switch while keeping the negative side switch closed. The controller can communicate with the switches (e.g., via wired and/or wireless connections) to control which switch is open and which switch is closed.

At step 204, a characteristic can be determined between the strings and the ground reference. The characteristic can be an impedance, voltage, or the like, that is measured by one or more of the impedance devices or that is calculated or otherwise derived from another characteristic measured by the impedance device(s). For example, an impedance device may measure a voltage and/or current between the strings and the ground reference. This or these measurements can be communicated or obtained by the controller, and the controller can calculate the impedance based on the measured voltage and/or current (e.g., by dividing the measured voltage by the measured current).

At step 206, the bus of the circuit is shifted relative to the ground reference in a second direction that is different from the first direction. This shift can be implemented by changing which switch is open at steps 202, 204 and which switch is closed at steps 202, 204. For example, if the positive side switch is opened and the negative side switch is closed at steps 202, 204, then the positive side switch is closed and the negative side switch is opened at step 206 (and step 208, as described below). Conversely, if the positive side switch is closed and the negative side switch is open at steps 202, 204, then the positive side switch is open and the negative side switch is closed at step 206 (and step 208, as described below).

At step 208, a characteristic between the strings and the ground reference is determined. The characteristic can be an impedance, voltage, or the like, that is measured, calculated, or otherwise derived by one or more of the impedance devices. The same or different impedance device used to determine the characteristic at step 204 may be used to determine the characteristic at step 208.

The bus of the circuit can be centered relative to ground when both switches are open. For example, the bus may not have any potential (positive or negative) while both the positive side switch and the negative side switch are open. Or the bus may not be centered relative to ground when both switches are open. The bus may have a positive or negative potential (e.g., voltage) while the positive side switch and the negative side switch are open. In either scenario, the potential of the bus can be shifted by opening and closing the switches and determining the characteristics as described above in connection with steps 202, 204, 206, 208.

The shifting of the bus can occur with both switches open or both switches closed. For example, both switches may be opened at step 202 and the characteristic determined at step 204 while both switches are open. Then, one or both switches may be closed at step 206 and the other characteristic determined at step 208 while one or both switches are closed. As another example, both switches may be closed at step 202 and the characteristic determined at step 204 while both switches are closed. Then, one or both switches may be opened at step 206 and the other characteristic determined at step 208 while one or both switches are open.

At step 210, a ground fault is identified in the strings based on or using the characteristics that are determined. The ground fault can be identified by determining the location and/or severity of the fault. The location of the ground fault can be the battery cell, cell group, cell stack, or pack that has the ground fault (e.g., the cell, cell group, cell stack, or pack that is undesirably or unintentionally connected to a ground reference). The severity of the ground fault can be an impedance of the ground fault. A connection between the location of the ground fault in the strings and the ground can have an impedance or resistance. As the impedance or resistance of this connection increases, the severity of a subsequent ground fault may be reduced. As the impedance or resistance of this connection decreases, the severity of the ground fault increases.

Figure 3:
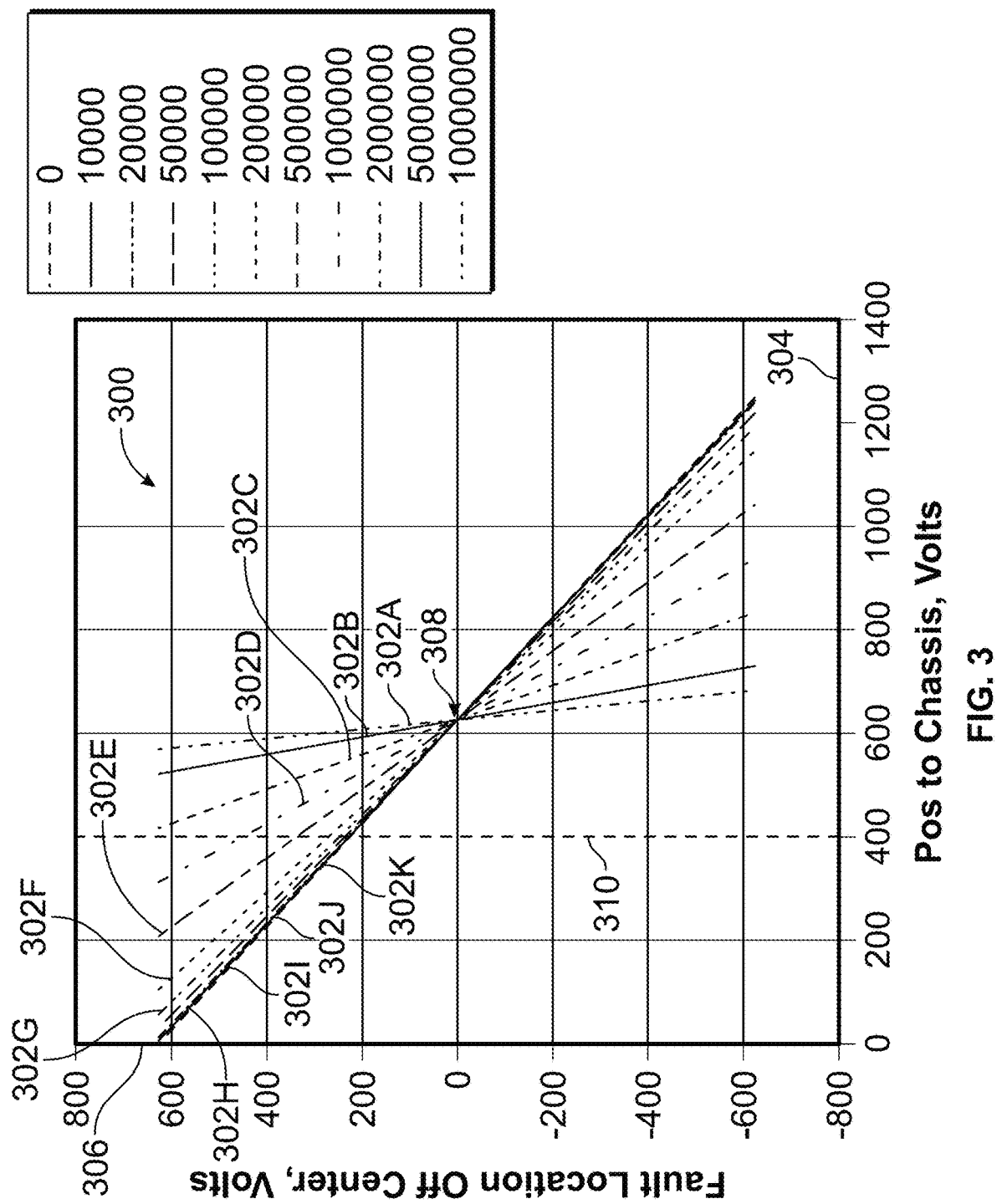
FIG. 3 illustrates a positive set of characteristic relationships associated with different severities of ground faults in battery strings while a conductive bus is shifted with switches open.
Figure 4:
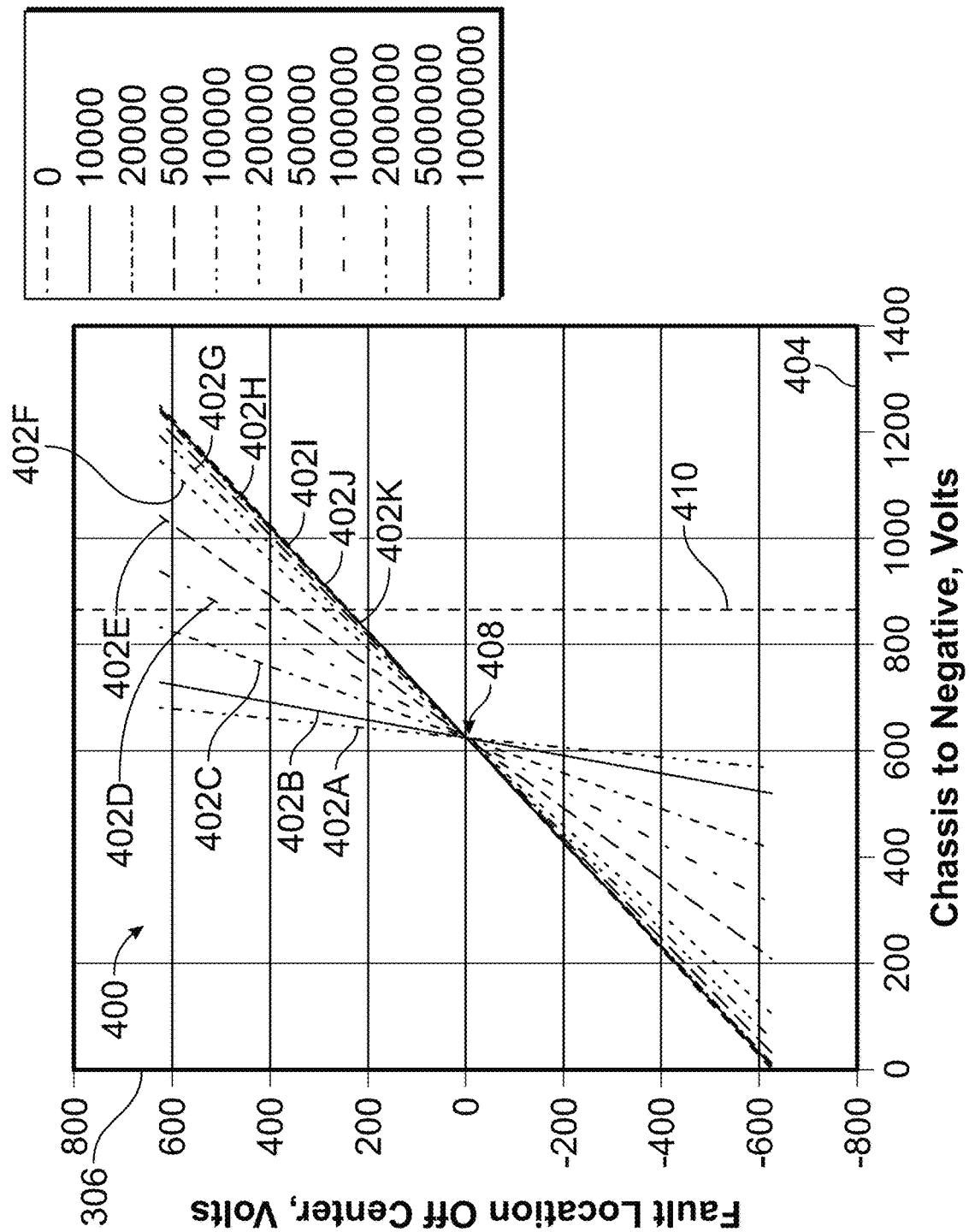
FIG. 4 illustrates a negative set of characteristic relationships associated with different severities of ground faults in the strings while the bus is shifted with both switches open.

FIG. 3 illustrates a positive set 300 of characteristic relationships 302A-K associated with different severities of ground faults in the strings while the bus is shifted with both switches open. The relationships shown in FIG. 3 are measured or calculated using one or more of the positive side impedance devices when the bus is shifted (e.g., shifted at 202 and measured or calculated at 204). FIG. 4 illustrates an example of a negative set 400 of characteristic relationships 402 (e.g., relationships 402A-K) associated with different severities of ground faults in the strings while the bus is intentionally centered. The bus may be intentionally centered when the impedances on both sides of the ground are equal, which also can mean that the potential on both sides of the ground are equal. Alternatively, the negative set of relationships shown in FIG. 4 may represent another state (e.g., when the bus is not intentionally centered). The relationships shown in FIG. 4 are measured or calculated using one or more of the negative side impedance devices when the bus is shifted (e.g., shifted at 202 and measured or calculated at 204). The different relationships in each set are associated with different locations (e.g., different cells, different cell groups, different cell stacks, or different packs) in the strings and different severities (e.g., different impedances between the location of the fault and the ground). The relationship associated with each location and severity can be empirically determined or measured, such as by creating ground faults at the different locations and measuring the characteristics using the positive and negative side impedance devices.

The positive side relationships 302A-K are shown alongside a horizontal axis 304 representative of different values of the characteristic determined using the positive side impedance device and a vertical axis 306 representative of different locations in the strings (e.g., different potentials of the strings). Because the cells in the strings may be partially or entirely connected in series with each other, different potentials along the vertical axis can represent different locations in the strings. The negative side relationships 402A-K are shown alongside a horizontal axis 404 representative of different values of the characteristic determined using the negative side impedance device and the vertical axis 306 described above.

In operation (according to one example), the switches can be opened, and the positive side impedance device can be used to measure or determine a characteristic of the bus. In the illustrated example, the positive side impedance device can measure or be used to calculate a voltage 310 of 400 volts as a characteristic, as shown in FIG. 3. But this single characteristic alone may not be useful for the controller to determine the location or severity of a ground fault. As shown in FIG. 3, the measured characteristic of 400 volts intersects 302D-K at different voltages along the vertical axis. Accordingly, from this single characteristic alone, it is unclear whether the location of the ground fault is at any value along the vertical axis that corresponds with the multiple intersections of 400 volts along the horizontal axis and the relationships 302D-K. Additionally, the relationships 302A-K intersect each other in a blind spot 308 where the severity of the ground fault would be unknown due to the characteristic value along the horizontal axis intersecting all of the relationships 302A-K at the blind spot.

A similar issue arises with the characteristic measured by the negative side impedance device. In operation (according to one example), the switches can be opened, and the negative side impedance device can be used to measure or determine a characteristic 410 of the bus, such as −850 volts (as shown in FIG. 4). But this single characteristic alone may not be useful for the controller to determine the location or severity of a ground fault due to the value of the characteristic along the horizontal axis intersecting multiple relationships 402D-K at different values along the vertical axis. As described above, from this single characteristic alone, it is unclear whether the location of the ground fault is at any value along the vertical axis that corresponds with the multiple intersections of −850 volts along the horizontal axis and the relationships 402D-K. Additionally, the relationships 402A-K intersect each other in another blind spot 408 where the severity of the ground fault would be unknown due to the characteristic value along the horizontal axis intersecting all of the relationships 402A-K at the blind spot.

Figure 5:
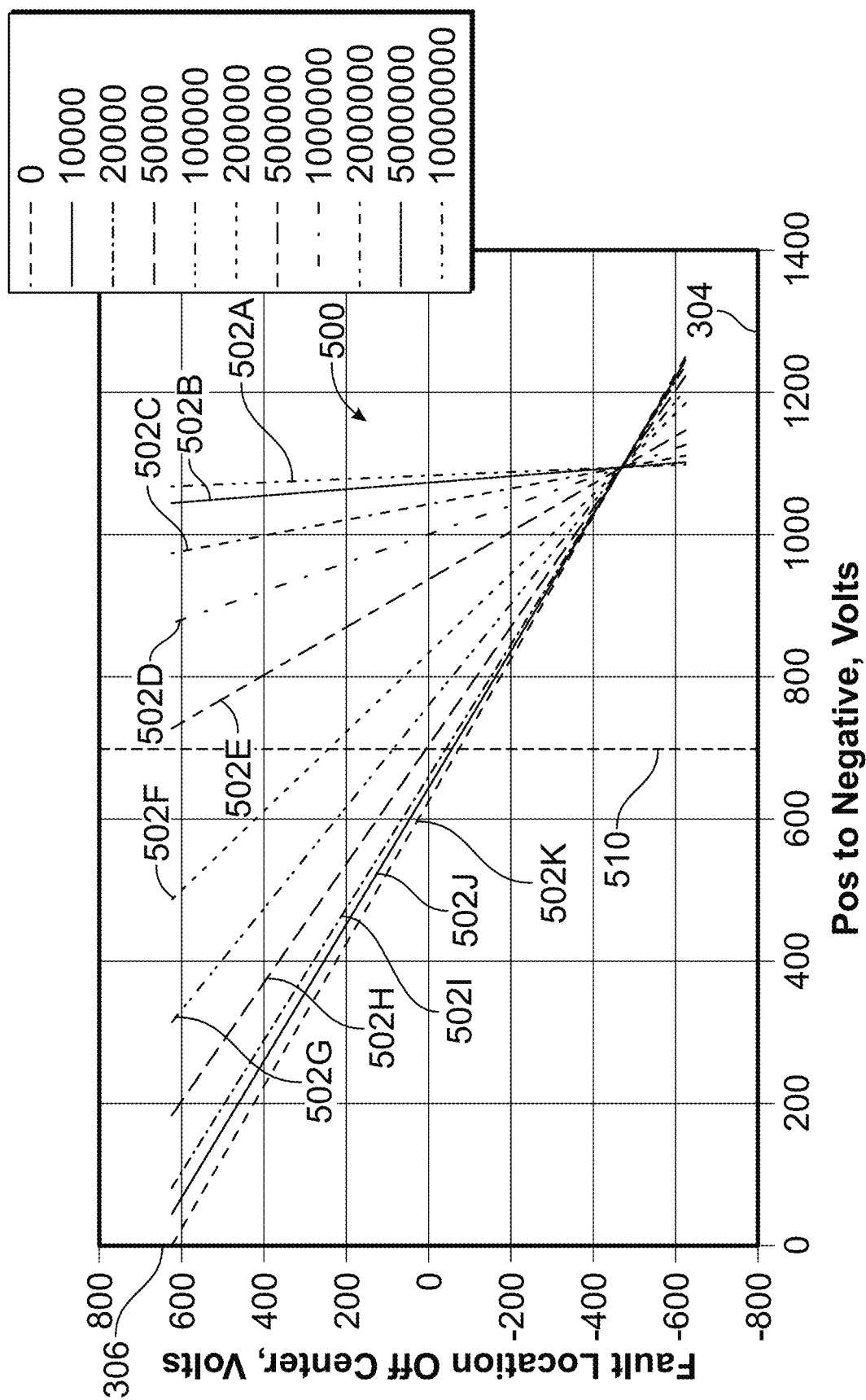
FIG. 5 illustrates another positive set of characteristic relationships associated with different severities of ground faults in the strings while the bus is shifted in a different direction than the positive set of characteristic relationships shown in FIG. 3.

The location and severity of the ground fault can be identified by shifting the bus, as described above. Shifting the bus can move or change the location of the blind spots described above. This creates a second equivalent circuit that can be used to solve for the unknowns as this second circuit introduces new or different impedance devices that were not in the circuit in the state when steps 202 and 204 are performed. FIG. 5 illustrates another positive set 500 of characteristic relationships 502A-K associated with different severities of ground faults in the strings while the bus is shifted in a different direction than the positive set 300 of characteristic relationships. For example, while the relationships 302A-K may be associated with the bus shifted by opening both switches, the relationships 502A-K may be associated with the bus shifted by closing one of the switches (e.g., the negative side switch) and keeping the other switch open. The relationships shown in FIG. 5 are measured or calculated using one or more of the positive side impedance devices when the bus is shifted (e.g., shifted at 206 and measured or calculated at 208). The positive side relationships 502A-K in FIG. 5 are shown alongside the horizontal axis 304 and the vertical axis 306 described above.

Figure 6:
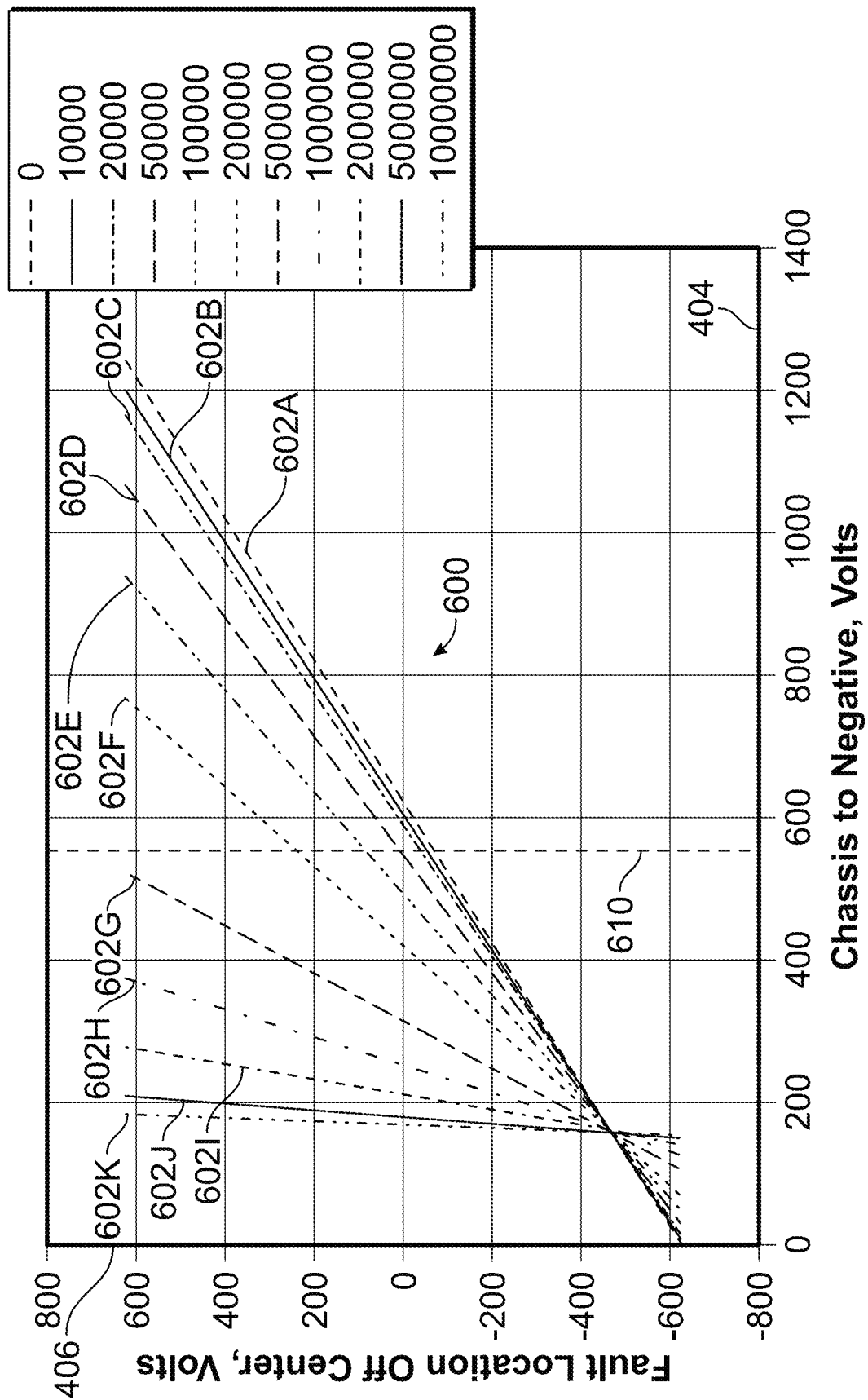
FIG. 6 illustrates another negative set of characteristic relationships associated with different severities of ground faults in the strings while the bus is shifted in a different direction than the relationships shown in FIG. 4.

FIG. 6 illustrates another negative set 600 of characteristic relationships 602A-K associated with different severities of ground faults in the strings while the bus is shifted in a different direction than the relationships 402A-K (e.g., with the negative side switch closed but the positive side switch remaining open). The relationships shown in FIG. 6 are measured or calculated using one or more of the negative side impedance devices when the bus is shifted (e.g., shifted at step 206 and measured or calculated at step 208). The different relationships in each set are associated with different locations in the strings and different severities. The relationship associated with each location and severity can be empirically determined or measured, such as by creating ground faults at the different locations and measuring the characteristics using the positive and negative side impedance devices. The negative side relationships 602 are shown alongside the horizontal axis 404 and the vertical axis 306 described above.

After measuring or calculating the voltage of 400 volts (shown in FIG. 3) using the positive side impedance device and measuring or calculating the voltage of 850 volts (shown in FIG. 4) using the negative side impedance device, the bus can be shifted by closing the positive side switch or the negative side switch, again measuring or calculating the voltage using the positive side impedance device, and again measuring or calculating the voltage using the negative side impedance device. In the example illustrated in FIGS. 5 and 6, the positive side impedance device measures or is used to calculate a voltage 510 of 700 volts (shown in FIG. 5) and the negative side impedance device measures or is used to calculate a voltage 610 of 550 volts (shown in FIG. 6).

These characteristics (e.g., voltages 310, 410, 510, 610) all intersect the relationship 302F, 402F, that are measured or calculated using the positive side impedance device and the negative side impedance device before shifting the bus (FIGS. 3 and 4) and after shifting the bus (FIGS. 5 and 6) can be used to determine the location and/or severity of a ground fault. In the example shown in FIGS. 3 through 6, the measured or calculated voltages 310, 410, 510, 610 all intersect the same locations in the strings (e.g., 275 volts along the vertical axes in FIGS. 3 through 6) for the relationships 302F, 402F, 502F, 602F (which are all labeled 200000 in the legends of FIGS. 3, 4, 5, and 6 to indicate the magnitude of the short, such as an impedance of 200,000 Ohms). Conversely, the calculated or measured voltages 310, 410, 510, 610 do not intersect the same location along the vertical axes for any other relationship. Accordingly, the location of the potential ground fault is at the string associated with the potential of 275 volts and the magnitude of the potential ground fault is identified as 200 kOhms. If the magnitude of the potential ground fault is less than a designated or customizable threshold, then the controller can determine that a ground fault exists.

Responsive to detecting such a ground fault, the controller can generate or annunciate an alarm (e.g., an audible sound, flashing light, or the like), notify an operator of the powered system of the identified fault (including the location and/or severity of the fault), and/or can isolate the string where the fault is located. The string can be isolated by opening switches on opposite sides of the string to disconnect the string from the bus. The controller can perform this test for the ground fault one or more times during operation of the powered system or energy storage system. For example, the controller may perform this test once a day (or more or less often) and while the battery strings are not being charged or powering any load. The controller can cycle through a series of closing the negative side switch (while the positive side switch is open) and then closing the positive side switch (while the negative side switch is open). The controller can obtain the measurements obtained using the positive side impedance device and the negative side impedance device during this series (a) while the positive and negative side switches are open (e.g., during the time between switching the negative side switch from closed to open while the positive side switch is still open or during the time before closing the positive side switch while the negative side switch is still open) and (b) while the negative side switch or the positive side switch is closed. The controller can use these measurements (or characteristics) to determine the location and/or severity of a ground fault, as described above.

Optionally, the controller can perform this test for a ground fault by identifying a time period (even if a transitory or short time period) that both the positive and negative side switches are open at the same time. The controller can use one or more of the impedance devices to measure or calculate the potential on the bus. If the bus has a positive or negative potential, then the controller can identify a ground fault within the battery strings without having to close either the positive or negative side switch. The controller can generate or annunciate the alarm that a ground fault is detected but may not notify the operator of the location or severity of the ground fault. The controller can control the positive and negative side switches to remain open to prevent the ground fault from damaging any components of the powered system or energy storage system.

The energy storage system may have several of the circuits shown in FIG. 1 that are coupled with one or more of the same loads. Each circuit may have a separate controller, or the same controller may be used to conduct the ground fault testing methods described herein. The time required to test the strings in the different circuits for ground faults may be reduced by examining multiple strings at the same time (e.g., dividing the circuits into different sets and smaller sets during each test iteration until the circuit with the ground fault is identified). For example, the energy storage system may have eight strings with an undetected ground fault in the fifth strings. The controller(s) can examine the potentials of the buses connected with the first through fourth strings to determine whether a ground fault exists, as described above. If no ground fault is detected, then the controller(s) can examine the potentials of the buses connected with the fifth through eighth strings to determine whether a ground fault exists. If a ground fault is detected in the fifth through eighth strings, then the controller(s) can examine the potentials of the buses in the fourth and fifth strings to determine whether a ground fault exists. When the presence of the ground fault is detected, the controller(s) can then separately examine the potentials of the buses connected with the fourth string and then the fifth string to determine that the ground fault is present in the fifth string. The controller can then shift the bus connected with the fifth string to determine the location and severity of the ground fault in the fifth string, as described above. Testing the many strings in this way can reduce the number of tests needed to identify the ground fault.

The bus of the circuit may be shifted in one or more ways other than closing one of the positive or negative side switch (as described above). For example, one or more of the inverters in the circuit can be fired or closed to shift the strings with respect to ground. As another example, the precharge switch or contactor can be closed to connect the resistor and/or additional circuitry to the bus (where the resistor and/or additional circuitry is referenced or connected to the ground or ground reference).

The detection system optionally can perform a tan delta test using components already present in the circuit to identify a failure or decrease in the insulation around the bus or other conductive components. The controller can activate at least one of the inverters at a first frequency to either conduct current from the strings or conduct current to the strings. For example, the controller can turn switches within the inverter between open and closed states at the first frequency to allow current to be conducted from the strings through the inverter(s) toward the load(s) at the first frequency or to allow current to be conducted through the inverter(s) toward the strings at the first frequency. Activating (or firing) the inverter(s) at the first frequency can create a waveform of the current that exits the inverter(s), such as a sinusoidal waveform.

One or more of the impedance devices can measure the current conducted through the bus by this waveform being generated. For example, one or more of the impedance devices can represent or include an ammeter that measures current conducted through the bus. The controller can then activate the inverter(s) at a second frequency that is different from the first frequency. The inverter(s) that are activated at the second frequency can be the same or different than the inverter that were activated at the first frequency. The same or other impedance device(s) can measure the current again while the inverter(s) are activated at the second frequency. The controller can then calculate a phase angle (and optionally, an impedance) from these measurements of the current (at the first frequency and the second frequency). The controller compares the phase angle to a threshold and, if the phase angle exceeds the threshold, the controller determines that the insulation (e.g., around the bus and/or strings) has failed or needs maintenance or replacement. Optionally, the controller can repeatedly calculate the phase angle and determine that the insulation has failed, is failing, or needs maintenance or replacement responsive to the phase angle increasing over time or increasing at a rate that exceeds a designated rate (even if the phase angle does not yet exceed the threshold). Optionally, the phase angle of a first string may be compared with the phase angle of another string. If the phase angles differ, then this difference can indicate a problem (e.g., insulation failure). The controller can then annunciate an alarm (as described above), send a signal to another device (e.g., a maintenance scheduling system) to schedule maintenance of the circuit, and/or deactivate the strings (e.g., by opening the positive side switches) to prevent the insulation fault from causing damage.

The system includes a controller 102 that operates to control states of electrically controllable switches 104 (e.g., switches 104A, 104B) in a circuit 106 of a powered system 108. The circuit includes a conductive bus 128 that conductively connects the components of the circuit with each other. This bus can represent one or more wires, traces, cables, or the like. The switch 104A can be referred to as a positive side switch as this switch is between the positive terminal, end, or output of the strings and the remainder of the circuit. The switch 104B can be referred to as a negative side switch as this switch is between the negative terminal, end, or output of the strings and the remainder of the circuit. The switches can be contactors or other types of electrical switches. The number and/or arrangement of the components of the circuit shown in FIG. 1 are provided merely as one example. Additional or fewer components may be provided, and/or the components may be in a different arrangement than what is shown.

The controller can represent hardware circuitry that includes and/or is connected with one or more processors (e.g., one or more integrated circuits, one or more field programmable gate arrays, one or more microprocessors, etc.) that operate to send signals via conductive pathways (e.g., wires, cables, conductive buses, conductive traces, etc.) and/or to send the signals wirelessly to the switches to control which switches are open, which switches are closed, and when switches are opened or closed. The controller can automatically generate these signals and/or can generate the signals based on input (e.g., from an operator and/or the powered system).

The circuit includes one or more strings 110 of battery cells 112 that supply energy (e.g., direct current) to one or more loads 114 of the powered system to power the loads. As described herein, a battery cell can refer to an electrochemical cell that is a device capable of generating electric energy from chemical reactions and/or storing electric energy for later use. A cell group can refer to two or more battery cells connected in parallel to each other. A cell stack can refer to two or more cell groups that are connected in series with each other. A pack can refer to two or more cell stacks connected in series with each other, and which optionally can be disposed in a packaging or housing. A string can refer to two or more packs connected in series with each other. Optionally, one or more of the switches may be disposed between subparts of at least one of the strings. For example, the positive side switch and/or negative side switch may be disposed between cells, between cell groups, between cell stacks, or between packs in a string.

The circuit can include a charging switch or contactor 134 that is opened or closed to couple the strings with the loads and a discharging switch or contactor 136 that is opened or closed to couple the strings with the external power source for charging the strings. The circuit can include a precharge switch or contactor 130 that is used to connect or disconnect the strings and the bus with a resistive element or load 132 to precharge the bus prior to closing the charging and discharging switches or contactors to couple the strings to the load and/or prior to closing the positive and negative side switches to couple an external power source (e.g., a utility grid, a generator, a traction motor operating as a generator, etc.) to the strings to charge the strings. The circuit can include inverters 138 (represented by six switches) that control conduction of the current from the strings to the load(s). The switches of the inverters can fire (e.g., close) at different times to convert the direct current supplied from the strings to an alternating current that is supplied to the load(s).

The powered system can represent a stationary or mobile system that is at least partially powered by electric energy stored in battery cells within the battery strings. For example, all the energy demand of the powered system may be provided by the battery strings or less than all the energy demand of the powered system may be provided by the battery strings. The powered system can be a vehicle, such as a mining vehicle, rail vehicle, automobile, truck, bus, marine vessel, agricultural vehicle, or the like. The loads can represent motors, lamps, processors, blowers, or the like.

The circuit includes a second ground reference connection 120 that is coupled with the strings by additional impedance devices in locations between each of the strings and the switches. A third ground reference connection 122 is coupled with the strings by additional impedance devices in a location between the positive side switch and a set of diodes 124 and in another location between the negative side switch and the load(s). One or more additional ground reference connections 126 are coupled with the strings by additional impedance devices and sets of diodes. The energy storage system optionally may have other equivalent strings disposed in parallel to the string shown in FIG. 1. These additional ground reference connections are coupled with the positive side switch by the sets of diodes between the positive side switch and the load(s) and are coupled with the negative side switch. One or more additional or fewer ground reference connections may be provided than what is shown in FIG. 1 (as represented by the ellipses in FIG. 1).

A ground fault in the strings can be made to be apparent (or more apparent) by mismatches in string positive and negative voltage measurements with respect to a ground reference. Comparing characteristics such as impedances (that can be calculated using these measured voltages), voltages, or the like, with respect to the ground before and after closing the switches can reveal the magnitude and location of ground faults. Closing the positive side switch or the negative side switch between measurements of the characteristics can shift the ground reference of the circuit to enable the magnitude and location of the ground fault to be identified. The magnitude of the ground fault is labeled as "Rfault" in FIG. 1.

In one embodiment, a method for identifying a location and/or magnitude of a ground fault in a circuit having a bus that connects battery strings with loads and a ground reference between the loads is provided. The method can include shifting the bus of the circuit relative to the ground reference in a first direction, determining a first impedance in the bus between the battery strings and the ground reference, shifting the bus of the circuit relative to the ground reference in a second direction, determining a second impedance in the bus between the battery strings and the ground reference, and identifying a location and/or severity of the ground fault based on a relationship between the first impedance and the second impedance.

The bus can be shifted relative to the ground reference in the first direction by closing a positive side switch disposed between a positive end of the battery strings and the loads. The bus can be shifted relative to the ground reference in the second direction by closing a negative side switch disposed between a negative end of the battery strings and the loads. The impedances can include one or more of voltage amplifiers, light emitting diodes, or grid resistors.

Identifying the battery cell can include identifying a first relationship between the first impedance that is measured and voltages of the battery cells, identifying a second relationship between the second impedance that is determined and the voltages of the battery cells, and determining which of the battery cells is associated with the first relationship and the second relationship. Each of the first relationship and the second relationship can be included in different sets of different relationships with each of the different relationships associated with a different cell of the battery cells. The different relationships in each of the different sets can intersect each other at an intersecting blind spot and shifting the bus in the first direction or the second direction changes the intersecting blind spot.

The bus can be coupled with a power source that charges the battery strings by a first contactor and with a load that is powered by the battery strings by a second contactor. Shifting the bus in the first direction, determining the first impedance, shifting the bus in the second direction, and determining the second impedance can occur while both the first contactor and the second contactor are open.

The bus can be coupled with a power source that charges the battery strings by a first contactor and with a load that is powered by the battery strings by a second contactor. The method also can include opening a positive side switch disposed between a positive end of the battery strings and the loads and a negative side switch disposed between a negative end of the battery strings and the loads. The positive side switch and the negative side switch can be opened while the first contactor and the second contactor are open. The method also can include determining whether the bus is shifted in the first direction or the second direction by determining a third impedance in the loads while the positive side switch and the negative side switch are open, the third impedance measured while the first contactor and the second contactor are open and preventing either the first contactor or the second contactor from closing responsive to determining that the bus has shifted based on the third impedance. The circuit can be a first circuit of several circuits, and shifting the bus in the first direction, determining the first impedance, shifting the bus in the second direction, and determining the second impedance can be performed at the same time for different sets of the circuits to determine whether the ground fault exists in any of the circuits in the set. The bus can be shifted relative to the ground reference in the first direction and in the second direction by closing one or more switches between a resistor and the loads.

The method also can include one or more of generating an alert to notify an operator of the battery cell having the ground fault, and/or deactivating or disconnecting the battery cell having the ground fault from the loads.

The bus can be shifted relative to the ground reference in the first direction and in the second direction by one or more of activating an inverter coupled with the battery strings and/or coupling a resistor and additional circuitry that are referenced to the ground reference to the bus.

In one embodiment, another method is provided that includes activating an inverter coupled with at least one battery string having two or more battery cells. The inverter is activated at a first frequency to one or more of send first current to or draw the first current from the at least one battery string. The method also includes determining the first current that is sent to or drawn from the at least one battery string, activating the inverter at a second frequency to one or more of send second current to or draw the second current from the at least one battery string, determining the second current that is sent to or drawn from the at least one battery string, determine an impedance and phase angle of the impedance from the first current and the second current that are measured, and identifying an insulation fault in a circuit having the at least one battery string and the inverter, the insulation fault identified responsive to the phase angle exceeding a threshold or the phase angle changing with respect to time. The method also can include scheduling maintenance of the circuit or deactivating the at least one battery string responsive to identifying the insulation fault.

In one embodiment, a system (e.g., a ground impedance and fault detection system) is provided and includes a controller configured to identify a location of a ground fault in a circuit having a bus that connects battery strings with loads and a ground reference between the loads. The controller is configured to identify the location of the ground fault by shifting the bus of the circuit relative to the ground reference in a first direction, determine a first impedance in the bus between the battery strings and the ground reference, shift the bus of the circuit relative to the ground reference in a second direction, determine a second impedance in the bus between the battery strings and the ground reference, and identify a battery cell of several battery cells in the battery strings as having the ground fault based on a relationship between the first impedance and the second impedance.

The controller can be configured to shift the bus relative to the ground reference in the first direction by closing a positive side switch disposed between a positive end of the battery strings and the loads. The controller can be configured to shift the bus relative to the ground reference in the second direction by closing a negative side switch disposed between a negative end of the battery strings and the loads. The bus may not be centered with respect to the ground reference while the bus is shifted.

Figure 7:
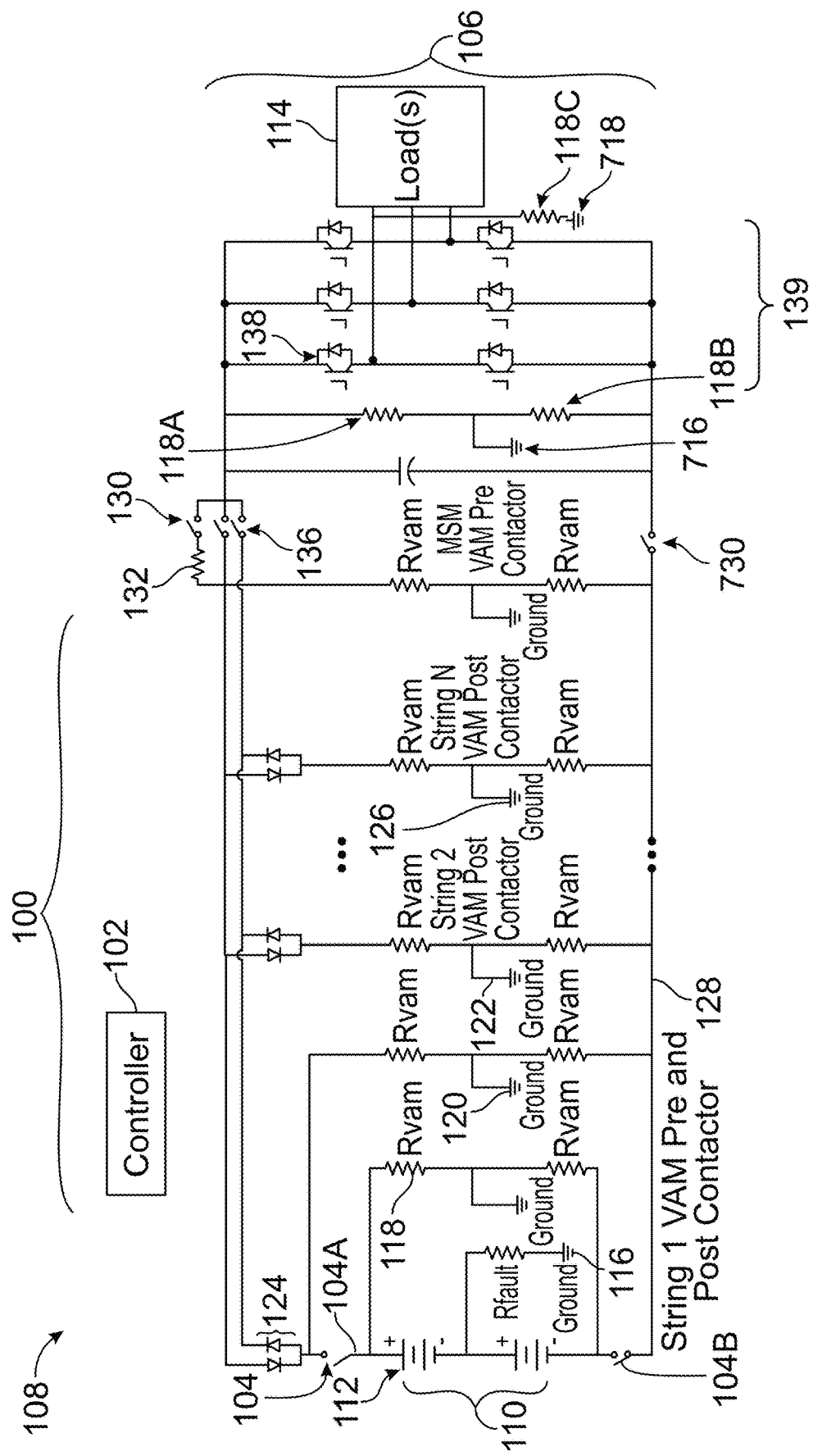
FIG. 7 illustrates another example of an energy storage system with ground impedance and/or fault detection capabilities.

FIG. 7 illustrates another example of the energy storage system shown in FIG. 1. One difference between the systems shown in FIGS. 1 and 7 is the inclusion of an additional ground reference connection 716 coupled with the strings by additional impedance devices 118A, B on opposite sides of the ground reference connection. These additional impedance devices and ground reference connection are located between (a) the precharge switch or contactor, the charging switch or contactor, and the discharging switch or contactor (on one side) and (b) the inverters and load(s) (on the other side). Additionally, the cable connecting the load(s) and the inverters may include an additional ground reference connection 718 coupled with an additional impedance device 118C. The system shown in FIG. 7 also includes a negative bank contactor or switch 730. This negative bank contactor can be coupled with the negative portion of the bus between one or more of the legs of impedance devices and ground connections described above and the additional impedance devices and additional ground reference connection.

In operation, the precharge switch or contactor, the charging switch or contactor, and the discharging switch or contactor can be opened, and the negative bank contactor can be closed (e.g., by the controller). If the impedance devices have an identical or similar (e.g., within manufacturing tolerances) impedance or resistance, then closing the negative bank contactor while these other contactors remain open should change the effective impedance or resistance of the impedance devices that are above the ground reference connections (e.g., between the ground reference connections and the positive side of the bus or top half of FIG. 7) and the effective impedance or resistance of the impedance devices that are below the ground reference connections (e.g., between the ground reference connections and the negative side of the bus or bottom half of FIG. 7) so that the effective impedance above the ground reference connections is a first designated fraction or percentage (e.g., one third or another value) of the total impedance or resistance while the effective impedance below the ground reference connections is a second designated fraction or percentage, such as the remaining designated fraction (e.g., one minus the first designated fraction, such as two thirds or another value) of the total impedance or resistance.

The impedance devices 118A, 118B can then be used to measure the voltage drop from the energy storage devices or batteries across the impedance devices. If the measured voltage drops coincide or correspond with the effective impedances, then the voltage drop across or through the additional impedance device between the additional ground connections and the positive bus should be the first designated fraction (e.g., one third) of the voltage of the energy storage devices or batteries, while the total voltage drop across or through the impedance devices between the ground connections and the negative bus should be the second or remainder designated fraction (e.g., two thirds) of the voltage of the energy storage devices or batteries. If the voltage drop across the impedance device 118A is not the first designated fraction (or within a tolerance range of this fraction such as 1%, 3%, or the like) of the voltage of the energy storage devices or batteries and/or the voltage drop across the impedance device 118B is not the second or remainder designated fraction (or within the tolerance range) of the voltage of the energy storage devices or batteries, then this can indicate a ground fault error in the system.

The closing of the negative bank contactor to test for a ground fault can check for a ground fault on the load side of the powered system (e.g., the side that includes the loads, such as the portion of the circuit shown in FIG. 7 that is to the right of the impedance devices 118A, 118B). Responsive to detection of the ground fault, an alarm or other notification to an operator may be generated, operation of a powered system (e.g., a vehicle or stationary system) that is at least partially powered by the energy storage system can be changed or deactivated (such as by deactivating the loads), the cells may be disconnected (by opening one or more of the switches or contactors described herein), or the like.

The three conductors connecting the load(s) to the switches of the inverter may represent a cable connecting the load(s) to the inverter. This cable may include a connection to the ground 718 via the impedance device 118C, such as a connection to the chassis of a vehicle or an earth ground reference. The controller can monitor voltage drops across the impedance devices 118A, 118B, and/or 118C (also referred to as a load impedance device or AC impedance device) to detect AC ground faults, as these types of faults can damage the battery cells. AC ground faults can product large and rapid changes in voltage drops across the load impedance device. These changes in voltage can oscillate or otherwise change at the switching frequency of the inverter. While an inverter is shown and described, another device may be used, such as a converter or chopper.

But, because the switching frequency of the inverter or inverters may be very fast and may change as the load(s) change operation (e.g., traction motors as the load(s) change speed), it can be more difficult to directly measure the voltage drop across the load impedance device to identify ground faults (when compared to measuring the voltage drop across the other impedance devices described above). For example, the controller may be unable to measure the voltage drop across the impedance device 118A or 118B at the same frequency as the switching frequency of the inverter, converter, chopper, etc.

To solve this problem and be able to measure the voltage drop across the impedance device for detection of AC ground faults related to operation of the load(s), the controller may asynchronously sample or measure the voltage drop across the impedance device by sampling this voltage drop at a frequency that differs from the switching frequency of the inverter.

Figure 8:
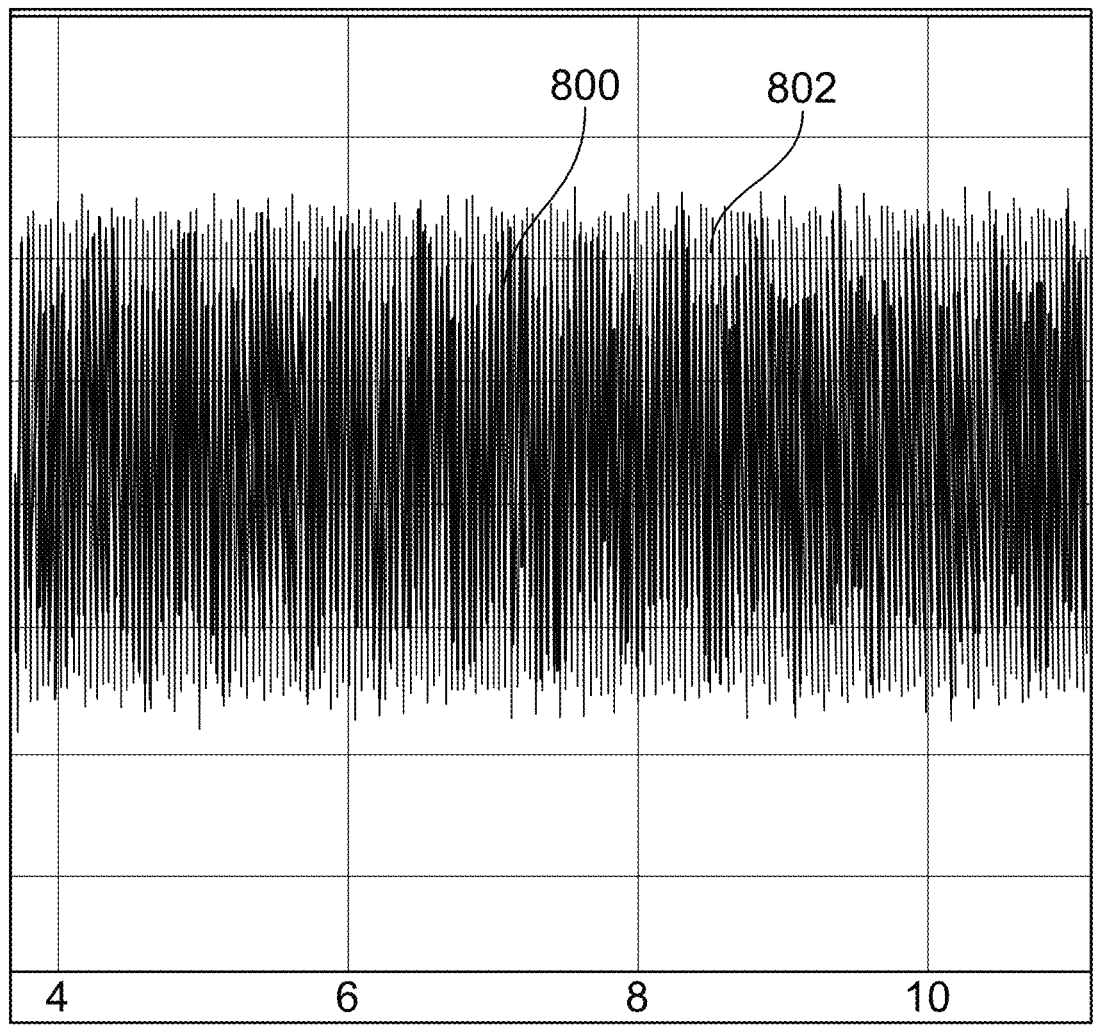
FIG. 8 illustrates one example of voltages across the impedance device shown in FIG. 7 and samples or measurements of the voltages across the impedance device.

FIG. 8 illustrates one example of voltages 800 across the impedance device shown in FIG. 7 and samples or measurements 802 of the voltages across the impedance device. The vertical direction in FIG. 8 represents magnitudes of the voltages and the horizontal direction represents time. As shown, the samples or measurements of the voltages may not exactly match the actual voltages due to the rapid oscillations of the voltages and the asynchronous sampling of the voltages. These oscillations may occur at the switching frequency of the inverter, which can be one to ten thousand kilohertz or another frequency. As a result, measurements of the voltages may not accurately reflect the actual voltages, as peaks of the actual voltages may be missed by the sampling. To measure the voltages more accurately, the controller may employ a peak hold technique to measure or sample the voltages.

Figure 9:
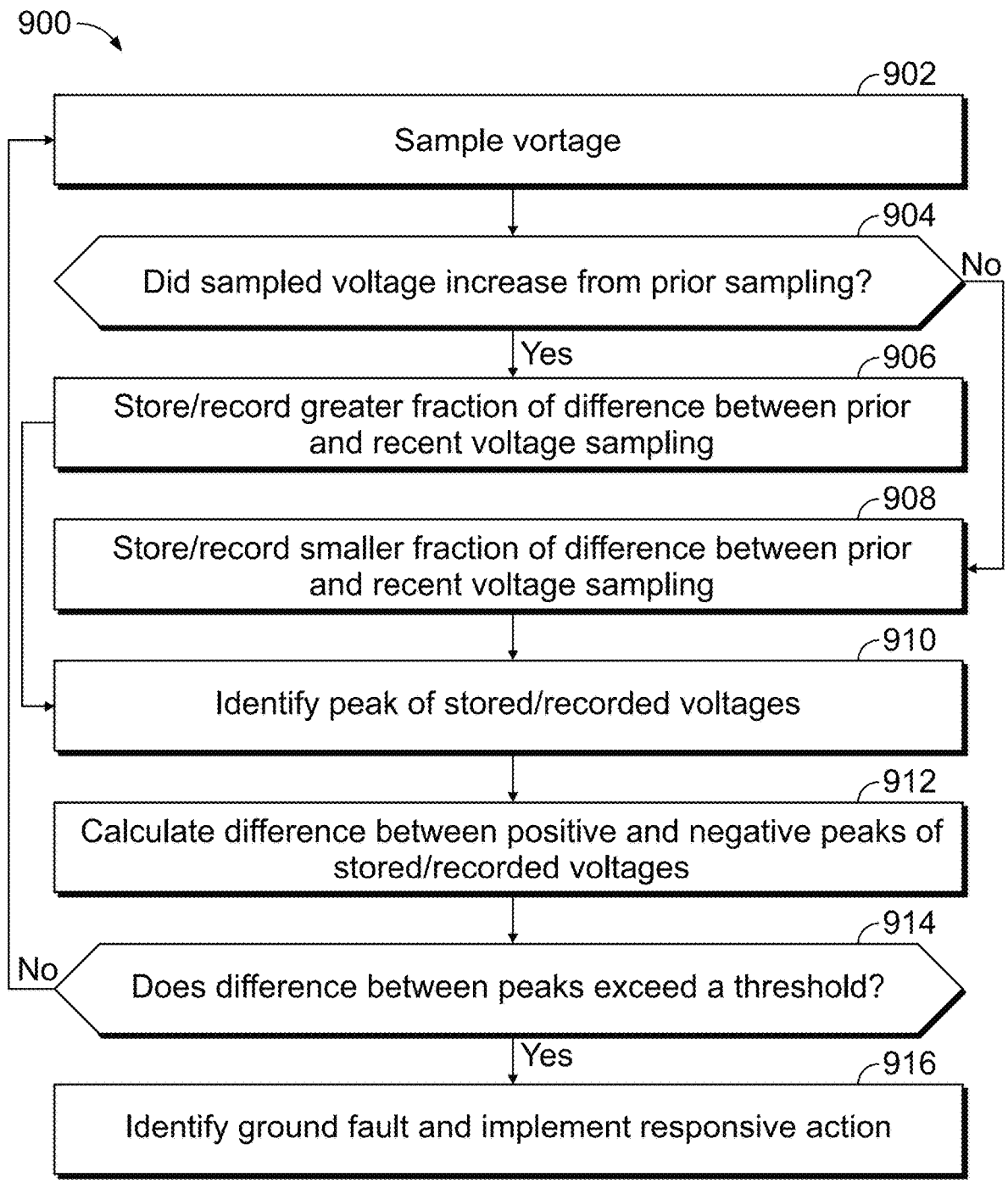
FIG. 9 illustrates a flowchart of one example of a method for performing a peak hold measurement of the voltages sampled by the controller via the impedance device.

FIG. 9 illustrates a flowchart of one example of a method 900 for performing a peak hold measurement of the voltages sampled by the controller via the impedance device (e.g., 118A or 118B, but also could be performed using 118C). At step 902, voltage is sampled. This voltage can be measured by the controller examining the voltage drop across the impedance device while the load is operating (e.g., while a traction motor is receiving AC from the battery cells as modified into AC by the inverter). At step 904, a decision is made as to whether the voltage measured (e.g., sampled) at step 902 is greater than the previously measured voltage. For example, the voltage may be measured several times during the implementation of the method, and the decision at step 904 compares measured voltages to determine whether the voltage measured at step 904 increased from the previously measured voltage. If the voltage did increase, then flow of the method can proceed toward step 906. But if the voltage did not increase, then flow of the method can proceed toward step 908.

At step 906, a voltage is recorded using a greater fraction of the difference. For example, a fraction or percentage of the difference between the voltage measured at step 904 and the previously measured voltage is calculated. This fraction or percentage may be large, such as half or 50%, two thirds or 67%, nine tenths or 90%, or the like. For example, if the sampled voltages increased from three hundred volts to five hundred volts, the controller may multiply the increase of two hundred volts by 50% (which is one hundred volts) and record a voltage of four hundred volts (i.e., one hundred volts added to the previous sampled voltage of three hundred volts). Flow of the method can then proceed toward step 910.

At step 908, a voltage is recorded using a smaller fraction of the difference. For example, a fraction or percentage of the difference between the voltage measured at step 904 and the previously measured voltage is calculated but using a smaller fraction or voltage than at step 906. This fraction or percentage may be small, such as one tenth or 10%, one twentieth or 5%, or the like. For example, if the sampled voltages decreased from five hundred volts to three hundred volts, the controller may multiply the decrease of two hundred volts by 10% (which is twenty volts) and record a voltage of four hundred eighty volts (i.e., twenty volts subtracted from the previous sampled voltage of five hundred volts). Flow of the method can then proceed toward step 910.

The steps 906 and 908 follow increases in sampled voltages more quickly and more closely than decreases in the sampled voltage. For example, using steps 906, 908, voltages that increase are represented by a recorded voltage that is closer to the increase when compared with voltages that decrease. This can help ensure that the recorded voltages are closer to or at the peak voltages than for voltages that are farther from or well below the peak voltages.

At step 910, the recorded voltages are examined to identify a peak. For example, the steps 902, 904, 906, 908 can be repeated many times to record several voltages. These recorded voltages may differ from the sampled or measured voltages as the recorded voltages are calculated as fractions or percentages of differences between voltages, as described above. The recorded voltages may be stored in a tangible and non-transitory computer readable memory internal to or accessible to the controller. The controller can examine these recorded voltages and find the greatest or largest of the recorded voltages, or a recorded voltage that is greater or larger than some, but not all, of the voltages.

The foregoing description determines the recorded and peak positive voltages measured by the impedance device. Steps 902, 904, 906, 908, and 910 can be repeated or concurrently performed for negative voltages. For example, at step 902, negative voltages can be sampled, at step 904, a decision is made as to whether the voltage measured (e.g., sampled) at step 902 is greater (e.g., more negative) than the previously measured voltage. If the voltage did increase (e.g., become more negative), then flow of the method can proceed toward step 906. But if the voltage did not increase (e.g., became less negative or closer to zero), then flow of the method can proceed toward step 908. At step 906, a negative voltage is recorded using a greater fraction of the difference, whereas at step 908, another negative voltage is recorded using a smaller fraction of the difference, as described above. At step 910, the recorded negative voltages are examined to identify a negative peak.

At step 912, a difference between the positive and negative peaks of the recorded voltages is calculated. For example, if the peak positive recorded voltage is four hundred fifty volts and the peak negative recorded voltage is negative three hundred volts, then a difference of seven hundred fifty volts is calculated. At step 914, a decision is made as to whether this difference that is calculated at step 912 exceeds a threshold difference. The threshold can be based on the voltage that is unsafe or potentially damaging to persons, the loads, the battery cells, etc. If the difference calculated at step 912 exceeds the threshold, then this may indicate that a ground fault associated with the loads and/or the cable to the loads has occurred. As a result, flow of the method can proceed toward step 916, where a ground fault is identified, and one or more responsive actions (described above) are implemented. For example, switches or contactors may be opened to disconnect the battery cells from the loads. Flow of the method can return to one or more other steps or may terminate. But, if the difference calculated at step 912 does not exceed the threshold, then this may not indicate that a ground fault associated with the loads and/or the cable to the loads has occurred. As a result, flow of the method can return to one or more other steps or may terminate.

In one example, a ground impedance and fault detection system may include a controller that can identify a location of a ground fault in a circuit having a positive portion of a bus that connects positive terminals of battery strings with loads and a negative portion of the bus that connects negative terminals of the battery strings with the loads. The circuit also may include a ground reference between the positive portion and the negative portion of the bus with impedance devices that can measure voltages on opposite sides of the ground reference. The circuit also may include one or more positive contactors connected with the positive portion of the bus between the battery strings and the load and a negative bus contactor coupled with the negative portion of the bus between the battery strings and the loads. The controller may identify the ground fault by opening the one or more positive contactors and closing the negative bus contactor, measuring the voltages using the impedance devices, and comparing the voltages that are measured.

The controller may measure the voltages that include a negative voltage drop measured by the impedance device between the ground reference and the negative portion of the bus and a positive voltage drop measured by the impedance device between the ground reference and the positive portion of the bus. The controller can identify the ground fault responsive to the positive voltage drop being greater than the negative voltage drop. The controller can identify the ground fault responsive to the positive voltage drop being at least a designated amount larger than the negative voltage drop.

The controller may asynchronously sample the voltages measured by one or more of the impedance devices to identify the ground fault associated with the load. The controller can asynchronously sample the voltages by following increases in the voltages that are sampled more closely than decreases in the voltages, and calculating differences between positive peaks in the voltages that are sampled and negative peaks in the voltages that are sampled. The controller may identify the ground fault responsive to one or more of the differences exceeding a threshold difference.

In another example, a method for detecting ground faults may include opening one or more positive contactors in a circuit having a positive portion of a bus that connects positive terminals of battery strings with loads and a negative portion of the bus that connects negative terminals of the battery strings with the loads. The circuit also may include a ground reference between the positive portion and the negative portion of the bus with impedance devices configured to measure voltages on opposite sides of the ground reference. The method also can include closing a negative bus contactor coupled with the negative portion of the bus between the battery strings and the loads, measuring the voltages using the impedance devices, and determining a ground fault location in the circuit by comparing the voltages that are measured.

The voltages that are measured may include a negative voltage drop measured by the impedance device between the ground reference and the negative portion of the bus and a positive voltage drop measured by the impedance device between the ground reference and the positive portion of the bus. The ground fault may be identified responsive to the positive voltage drop being greater than the negative voltage drop. The ground fault may be identified responsive to the positive voltage drop being at least twice as large as the negative voltage drop.

The circuit can include an inverter between the battery strings and the loads and a load ground reference connected with the load between the inverter and the load. The impedance devices may include a load impedance device between the load ground reference and the inverter. The method may also include asynchronously sampling the voltages measured by the load impedance device to identify the ground fault associated with the load. The voltages can be asynchronously sampled by following increases in the voltages more closely than decreases in the voltages and calculating differences between positive peaks in the voltages and negative peaks in the voltages. The ground fault may be identified responsive to one or more of the differences exceeding a threshold difference.

In another example, another ground fault identification system may include a controller that can identify a ground fault in a circuit having a positive portion of a bus that connects positive terminals of battery strings with an inverter and a negative portion of the bus that connects negative terminals of the battery strings with the inverter. The circuit also may include a ground reference between the inverter and a load that is powered by the battery strings and the inverter. The circuit can include an impedance device configured to measure voltages between the inverter or the load and the ground reference. The controller may identify the ground fault by asynchronously sampling the voltages measured by the load impedance device to identify the ground fault associated with the load.

The controller can asynchronously sample the voltages by following increases in the voltages that are sampled more closely than decreases in the voltages, and may calculate differences between positive peaks in the voltages that are sampled and negative peaks in the voltages that are sampled. The controller may follow the increases in the voltages more closely by calculating a larger fraction of the increases than the decreases, and using the larger fraction of the increases to identify the positive peaks. The controller may follow the decreases in the voltages less closely by calculating a smaller fraction of the decreases than the increases, and using the smaller fraction of the decreases to identify the negative peaks.

The controller can identify the ground fault responsive to one or more of the differences exceeding a threshold difference. The controller may follow the increases in the voltages more closely by calculating a larger fraction of the increases than the decreases, and using the larger fraction of the increases to identify the positive peaks. The controller can follow the decreases in the voltages less closely by calculating a smaller fraction of the decreases than the increases, and using the smaller fraction of the decreases to identify the negative peaks, and the controller is configured to identify the ground fault responsive to one or more of the differences exceeding a threshold difference.

In one embodiment, the controllers or systems described herein may have a local data collection system deployed and may use machine learning to enable derivation-based learning outcomes. The controllers may learn from and make decisions on a set of data (including data provided by the various sensors), by making data-driven predictions and adapting according to the set of data. In embodiments, machine learning may involve performing a plurality of machine learning tasks by machine learning systems, such as supervised learning, unsupervised learning, and reinforcement learning. Supervised learning may include presenting a set of example inputs and desired outputs to the machine learning systems. Unsupervised learning may include the learning algorithm structuring its input by methods such as pattern detection and/or feature learning. Reinforcement learning may include the machine learning systems performing in a dynamic environment and then providing feedback about correct and incorrect decisions. In examples, machine learning may include a plurality of other tasks based on an output of the machine learning system. In examples, the tasks may be machine learning problems such as classification, regression, clustering, density estimation, dimensionality reduction, anomaly detection, and the like. In examples, machine learning may include a plurality of mathematical and statistical techniques. In examples, the many types of machine learning algorithms may include decision tree based learning, association rule learning, deep learning, artificial neural networks, genetic learning algorithms, inductive logic programming, support vector machines (SVMs), Bayesian network, reinforcement learning, representation learning, rule-based machine learning, sparse dictionary learning, similarity and metric learning, learning classifier systems (LCS), logistic regression, random forest, K-Means, gradient boost, K-nearest neighbors (KNN), a priori algorithms, and the like. In embodiments, certain machine learning algorithms may be used (e.g., for solving both constrained and unconstrained optimization problems that may be based on natural selection). In an example, the algorithm may be used to address problems of mixed integer programming, where some components restricted to being integer-valued. Algorithms and machine learning techniques and systems may be used in computational intelligence systems, computer vision, Natural Language Processing (NLP), recommender systems, reinforcement learning, building graphical models, and the like. In an example, machine learning may be used making determinations, calculations, comparisons and behavior analytics, and the like.

In one embodiment, the controllers may include a policy engine that may apply one or more policies. These policies may be based at least in part on characteristics of a given item of equipment or environment. With respect to control policies, a neural network can receive input of a number of environmental and task-related parameters. These parameters may include, for example, operational input regarding operating equipment, data from various sensors, location and/or position data, and the like. The neural network can be trained to generate an output based on these inputs, with the output representing an action or sequence of actions that the equipment or system should take to accomplish the goal of the operation. During operation of one embodiment, a determination can occur by processing the inputs through the parameters of the neural network to generate a value at the output node designating that action as the desired action. This action may translate into a signal that causes the vehicle to operate. This may be accomplished via back-propagation, feed forward processes, closed loop feedback, or open loop feedback. Alternatively, rather than using backpropagation, the machine learning system of the controller may use evolution strategies techniques to tune various parameters of the artificial neural network. The controller may use neural network architectures with functions that may not always be solvable using backpropagation, for example functions that are non-convex. In one embodiment, the neural network has a set of parameters representing weights of its node connections. A number of copies of this network are generated and then different adjustments to the parameters are made, and simulations are done. Once the output from the various models are obtained, they may be evaluated on their performance using a determined success metric. The best model is selected, and the vehicle controller executes that plan to achieve the desired input data to mirror the predicted best outcome scenario. Additionally, the success metric may be a combination of the optimized outcomes, which may be weighed relative to each other.

As used herein, the terms "processor" and "computer," and related terms, e.g., "processing device," "computing device," and "controller" may be not limited to just those integrated circuits referred to in the art as a computer, but refer to a microcontroller, a microcomputer, a programmable logic controller (PLC), field programmable gate array, and application specific integrated circuit, and other programmable circuits. Suitable memory may include, for example, a computer-readable medium. A computer-readable medium may be, for example, a random-access memory (RAM), a computer-readable non-volatile medium, such as a flash memory. The term "non-transitory computer-readable media" represents a tangible computer-based device implemented for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. As such, the term includes tangible, computer-readable media, including, without limitation, non-transitory computer storage devices, including without limitation, volatile and non-volatile media, and removable and non-removable media such as firmware, physical and virtual storage, CD-ROMS, DVDs, and other digital sources, such as a network or the Internet.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A system, comprising:
a controller configured to identify a location of a ground fault in a circuit having a positive portion of a bus that connects positive terminals of battery strings with loads and a negative portion of the bus that connects negative terminals of the battery strings with the loads, the circuit also including a ground reference between the positive portion and the negative portion of the bus with impedance devices configured to measure voltages on opposite sides of the ground reference, the circuit also including one or more positive contactors connected with the positive portion of the bus between the battery strings and the load and a negative bus contactor coupled with the negative portion of the bus between the battery strings and the loads,
the controller configured to identify the ground fault by opening the one or more positive contactors and closing the negative bus contactor, measuring the voltages using the impedance devices, and comparing the voltages that are measured.

2. The system of claim 1, wherein the controller is configured to measure the voltages that include a negative voltage drop measured by the impedance device between the ground reference and the negative portion of the bus and a positive voltage drop measured by the impedance device between the ground reference and the positive portion of the bus.

3. The system of claim 2, wherein the controller is configured to identify the ground fault responsive to the positive voltage drop being greater than the negative voltage drop.

4. The system of claim 2, wherein the controller is configured to identify the ground fault responsive to the positive voltage drop being at least a designated amount larger than the negative voltage drop.

5. The system of claim 1, wherein the controller is configured to asynchronously sample the voltages measured by one or more of the impedance devices to identify the ground fault associated with the load.

6. The system of claim 5, wherein the controller is configured to asynchronously sample the voltages by following increases in the voltages that are sampled more closely than decreases in the voltages, and calculating differences between positive peaks in the voltages that are sampled and negative peaks in the voltages that are sampled.

7. The system of claim 6, wherein the controller is configured to identify the ground fault responsive to one or more of the differences exceeding a threshold difference.

8. A method, comprising:

opening one or more positive contactors in a circuit having a positive portion of a bus that connects positive terminals of battery strings with loads and a negative portion of the bus that connects negative terminals of the battery strings with the loads, the circuit also including a ground reference between the positive portion and the negative portion of the bus with impedance devices configured to measure voltages on opposite sides of the ground reference;

closing a negative bus contactor coupled with the negative portion of the bus between the battery strings and the loads;

measuring the voltages using the impedance devices; and determining a ground fault location in the circuit by comparing the voltages that are measured.

9. The method of claim 8, wherein the voltages that are measured include a negative voltage drop measured by the impedance device between the ground reference and the negative portion of the bus and a positive voltage drop measured by the impedance device between the ground reference and the positive portion of the bus.

10. The method of claim 9, wherein the ground fault is identified responsive to the positive voltage drop being greater than the negative voltage drop.

11. The method of claim 9, wherein the ground fault is identified responsive to the positive voltage drop being at least twice as large as the negative voltage drop.

12. The method of claim 8, further comprising asynchronously sampling the voltages measured by one or more of the impedance devices to identify the ground fault associated with the load.

13. The method of claim 12, wherein the voltages are asynchronously sampled following increases in the voltages more closely than decreases in the voltages and calculating differences between positive peaks in the voltages and negative peaks in the voltages.

14. The method of claim 13, wherein the ground fault is identified responsive to one or more of the differences exceeding a threshold difference.

15. A system, comprising:

a controller configured to identify a ground fault in a circuit having a positive portion of a bus that connects positive terminals of battery strings with an inverter and a negative portion of the bus that connects negative terminals of the battery strings with the inverter, the circuit also including a ground reference between the inverter and a load that is powered by the battery strings and the inverter, the circuit including an impedance device configured to measure voltages between the inverter or the load and the ground reference, the controller configured to identify the ground fault by asynchronously sampling the voltages measured by the load impedance device to identify the ground fault associated with the load.

16. The system of claim 15, wherein the controller is configured to asynchronously sample the voltages by following increases in the voltages that are sampled more closely than decreases in the voltages, and calculating differences between positive peaks in the voltages that are sampled and negative peaks in the voltages that are sampled.

17. The system of claim 16, wherein the controller is configured to follow the increases in the voltages more closely by calculating a larger fraction of the increases than the decreases, and using the larger fraction of the increases to identify the positive peaks.

18. The system of claim 16, wherein the controller is configured to follow the decreases in the voltages less closely by calculating a smaller fraction of the decreases than the increases, and using the smaller fraction of the decreases to identify the negative peaks.

19. The system of claim 16, wherein the controller is configured to identify the ground fault responsive to one or more of the differences exceeding a threshold difference.

20. The system of claim 16, wherein the controller is configured to follow the increases in the voltages more closely by calculating a larger fraction of the increases than the decreases, and using the larger fraction of the increases to identify the positive peaks, the controller is configured to follow the decreases in the voltages less closely by calculating a smaller fraction of the decreases than the increases, and using the smaller fraction of the decreases to identify the negative peaks, and the controller is configured to identify the ground fault responsive to one or more of the differences exceeding a threshold difference.

* * * * *